US011069271B2

(12) United States Patent
Gao et al.

(10) Patent No.: US 11,069,271 B2
(45) Date of Patent: Jul. 20, 2021

(54) SHIFT REGISTER UNIT AND DRIVING METHOD THEREOF, GATE DRIVING CIRCUIT AND DISPLAY DEVICE

(71) Applicants: Beijing BOE Display Technology Co., Ltd., Beijing (CN); BOE Technology Group Co., Ltd., Beijing (CN)

(72) Inventors: Yingqiang Gao, Beijing (CN); Huabin Chen, Beijing (CN); Yang Liu, Beijing (CN); Ranyi Zhou, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 171 days.

(21) Appl. No.: 16/326,434

(22) PCT Filed: Mar. 7, 2018

(86) PCT No.: PCT/CN2018/078286
§ 371 (c)(1),
(2) Date: Feb. 19, 2019

(87) PCT Pub. No.: WO2018/201791
PCT Pub. Date: Nov. 8, 2018

(65) Prior Publication Data
US 2020/0175903 A1 Jun. 4, 2020

(30) Foreign Application Priority Data

May 5, 2017 (CN) .......................... 201710314162.6

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
CPC ............. G09G 3/20; G09G 2310/0267; G09G 2310/0286; G09G 2310/08; G09G 2320/0214; G11C 19/28
See application file for complete search history.

(56) References Cited

U.S. PATENT DOCUMENTS

| 10,319,452 | B2 | 6/2019 | Wu et al. | |
|---|---|---|---|---|
| 2014/0079173 | A1* | 3/2014 | Yan | G11C 19/28 377/64 |
| 2015/0371716 | A1* | 12/2015 | Shao | G11C 19/287 345/100 |

FOREIGN PATENT DOCUMENTS

| CN | 101989412 A | 3/2011 |
|---|---|---|
| CN | 105702294 A | 6/2016 |

(Continued)

OTHER PUBLICATIONS

Office Action, including Search Report, for Chinese Patent Application No. 201710314162.6, dated Aug. 17, 2018, 12 pages.

(Continued)

*Primary Examiner* — Abhishek Sarma
(74) *Attorney, Agent, or Firm* — Westman, Champlin & Koehler, P.A.

(57) ABSTRACT

Embodiments of the present disclosure provide a shift register unit and a driving method thereof, a gate driving circuit and a display device. The shift register unit comprises a shift register and a potential stabilizing circuit. The potential stabilizing circuit is configured to provide a signal from the reference signal terminal to the pulling-up node and the (Continued)

outputting signal terminal respectively, under a control of the potential stabilizing controlling terminal.

8 Claims, 10 Drawing Sheets

(56) References Cited

FOREIGN PATENT DOCUMENTS

| CN | 106157912 A | 11/2016 |
|----|-------------|---------|
| CN | 205984242 U | 2/2017 |
| CN | 106504721 A | 3/2017 |
| CN | 106910452 A | 6/2017 |

OTHER PUBLICATIONS

International Search Report and Written Opinion (including English translations of Search Report and Box V of Written Opinion) for International Application No. PCT/CN2018/078286, dated Jun. 12, 2018, 14 pages.

\* cited by examiner

SHIFT REGISTER UNIT AND DRIVING METHOD THEREOF, GATE DRIVING CIRCUIT AND DISPLAY DEVICE

CROSS-REFERENCE TO RELATED APPLICATION(S)

This application is a Section 371 National Stage Application of International Application No. PCT/CN2018/078286, filed on 7 Mar. 2018, which published as WO 2018/201791 A1 on 8 Nov. 2018, which claims the priority of Chinese Patent Application No. 201710314162.6, filed on May 5, 2017, the entire contents of which are hereby incorporated by reference.

TECHNICAL FIELD

Embodiments of the present invention relate to the field of display technologies, and in particular, to a shift register unit and a driving method thereof, a gate driving circuit and a display device.

BACKGROUND

Conventional gate driving circuits usually comprise a plurality of cascaded shift registers. The shift register in each stage may be coupled to one corresponding gate line. Inputting scanning signals to the gate lines of each column on a display panel is implemented by the shift registers in respective stages. In the conventional shift register, transistors configured to control an output may supply a high level signal from a clock signal terminal to an outputting signal terminal under a control of a level at a pulling-up node, so as to output an effective high-level scanning signal. After entering into a resetting period, the transistors configured to control the output are turned off under the control of the level at the pulling-up node, and the outputting signal terminal is enabled to output a low level outputting signal under the control of a level at the pulling-down node. However, during a period after the resetting phase, the pulling-up node and the outputting signal terminal will be in a floating state. This results in a possibility of being affected by a leakage of surrounding transistors, which may further cause the level at the gates of outputting transistors and the level at the outputting signal terminal unstable.

SUMMARY

Embodiments of the present disclosure provide a shift register unit, a method for driving the shift register unit, a gate driving circuit and a display device.

According to one aspect of the embodiments of the present disclosure, a shift register unit is provided, comprising: a shift register and a potential stabilizing circuit. The shift register may comprise a pulling-up node. The shift register is configured to output an outputting signal of effective level at an outputting signal terminal under a control of a level at the pulling-up node. The potential stabilizing circuit may be configured to receive a potential stabilizing controlling signal from a potential stabilizing controlling terminal, and provide a signal from a reference signal terminal to the pulling-up node and the outputting signal terminal respectively, under a control of the potential stabilizing controlling signal.

For example, the potential stabilizing circuit may comprise a first potential stabilizing sub-circuit and a second potential stabilizing sub-circuit, wherein:

the first potential stabilizing sub-circuit is configured to provide a signal from the reference signal terminal to the pulling-up node under the control of the potential stabilizing controlling signal; and the second potential stabilizing sub-circuit is configured to provide the signal from the reference signal terminal to the outputting signal terminal under the control of the potential stabilizing controlling signal.

For another example, the first potential stabilizing sub-circuit comprises: a first switching transistor having a controlling electrode electrically coupled to the potential stabilizing controlling terminal, a first electrode electrically coupled to the reference signal terminal, and a second electrode electrically coupled to the pulling-up node.

For another example, the second potential stabilizing sub-circuit comprises: a second switching transistor having a controlling electrode electrically coupled to the potential stabilizing controlling terminal, a first electrode electrically coupled to the reference signal terminal, and a second electrode electrically coupled to the outputting signal terminal.

For another example, the shift register comprises: an inputting circuit, a resetting circuit, a first controlling circuit, a second controlling circuit, and an outputting circuit, wherein:

the inputting circuit is configured to receive an inputting signal from an inputting signal terminal, and provide the inputting signal to the pulling-up node under a control of the inputting signal;

the resetting circuit is configured to provide the signal from the reference signal terminal to the pulling-up node under a control of a signal from a resetting signal terminal;

the first controlling circuit is configured to receive a first clock signal from a first clock signal terminal, and provide the first clock signal to the pulling-down node under a control of the first clock signal, and provide the signal from the reference signal terminal to the pulling-down node under the control of the level at the pulling-up node;

the second controlling circuit is configured to provide the signal from the reference signal terminal to the pulling-up node under a control of a level at the pulling-down node; and the outputting circuit is configured to provide a second clock signal to the outputting signal terminal under the control of the level at the pulling-up node, maintain a difference between the level at the pulling-up node and a level at the outputting signal terminal in response to the pulling-up node being in a floating state, and provide the signal from the reference signal terminal to the outputting signal terminal under the control of the level at the pulling-down node.

For another example, the inputting circuit comprises: a third switching transistor having a controlling electrode and a first electrode both electrically coupled to the inputting signal terminal, and a second electrode electrically coupled to the pulling-up node;

the resetting circuit comprises: a fourth switching transistor having a controlling electrode electrically coupled to the resetting signal terminal, a first electrode electrically coupled to the reference signal terminal, and a second electrode electrically coupled to the pulling-up node;

the first controlling circuit comprises: a fifth switching transistor, a sixth switching transistor, a seventh switching transistor, and an eighth switching transistor, wherein the fifth switching transistor has a controlling electrode and a first electrode both electrically coupled to the first clock signal terminal, and a second electrode electrically coupled to a controlling electrode of the sixth switching transistor;

the sixth switching transistor has a first electrode electrically coupled to the first clock signal terminal and a second electrode electrically coupled to the pulling-down node; the seventh switching transistor has a controlling electrode electrically coupled to the pulling-up node, a first electrode electrically coupled to the reference signal terminal, and a second electrode electrically coupled to the controlling electrode of the sixth switching transistor; the eighth switching transistor has a controlling electrode electrically coupled to the pulling-up node, a first electrode electrically coupled to the reference signal terminal, and a second electrode electrically coupled to the pulling-down node;

the second controlling circuit comprises: a ninth switching transistor having a controlling electrode electrically coupled to the pulling-down node, a first electrode electrically coupled to the reference signal terminal, and a second electrode electrically coupled to the pulling-up node; and the outputting circuit comprises: a tenth switching transistor, an eleventh switching transistor, and a capacitor, wherein the tenth switching transistor has a controlling electrode electrically coupled to the pulling-up node, a first electrode electrically coupled to the second clock signal terminal, and a second electrode electrically coupled to the outputting signal terminal; the eleventh switching transistor has a controlling electrode electrically coupled to the pulling-down node, a first electrode electrically coupled to the reference signal terminal, and a second electrode electrically coupled to the outputting signal terminal; the capacitor has a first electrode electrically coupled to the pulling-up node and a second electrode electrically coupled to the outputting signal terminal.

According to another aspect of the embodiments of the present disclosure, there is provided a gate driving circuit, comprising a plurality of shift register units of any of above embodiments which are cascaded, wherein:

each of the shift register units other than the shift register unit in a last stage has the potential stabilizing controlling terminal electrically coupled to the pulling-down node of the shift register unit in a subsequent stage.

According to another aspect of the embodiments of the present disclosure, there is provided a display device comprising the gate driving circuit of any of above embodiments.

According to another aspect of the embodiments of the present disclosure, method for driving the shift register unit of any of above embodiments, comprising:

during a first period, supplying, by the inputting circuit, the signal from the inputting signal to the pulling-up node under the control of the inputting signal; supplying, by the first controlling circuit, the signal from the reference signal terminal to the pulling-down node under the control of the level at the pulling-up node;

during a second period, supplying, by the outputting circuit, the second clock signal to the outputting signal terminal under the control of the level at the pulling-up node, and maintaining the difference between the level at the pulling-up node and the level at the outputting signal terminal in response to the pulling-up node being in the floating state;

during a third period, supplying, by the resetting circuit, the signal from the reference signal terminal to the pulling-up node under the control of a signal from the resetting signal terminal; supplying, by the first controlling circuit, the first clock signal to the pulling-down node under the control of the first clock signal; supplying, by the second controlling circuit, the signal from the reference signal terminal to the pulling-up node under the control of the level at the pulling-down node; and supplying, by the outputting circuit, the signal from the reference signal terminal to the outputting signal terminal under the control of the level at the pulling-down node; and during a fourth period, supplying, by the potential stabilizing circuit, the signal from the reference signal terminal to the pulling-up node and the outputting signal terminal respectively, under the control of the potential stabilizing controlling signal.

DETAILED DESCRIPTION

In order to make objectives, solutions and advantages of the present disclosure more clearly, a shift register unit, a method for driving the shift register unit, a gate driving circuit and a display device according to the embodiments of the present disclosure will be described in detail below with reference to the accompanying drawings and specific implementations. It should be noted that the preferred embodiments described below are only to be construed as illustrative but not limiting. The embodiments in the present application and the features in the embodiments may be combined with each other without conflict.

Figure 1A:
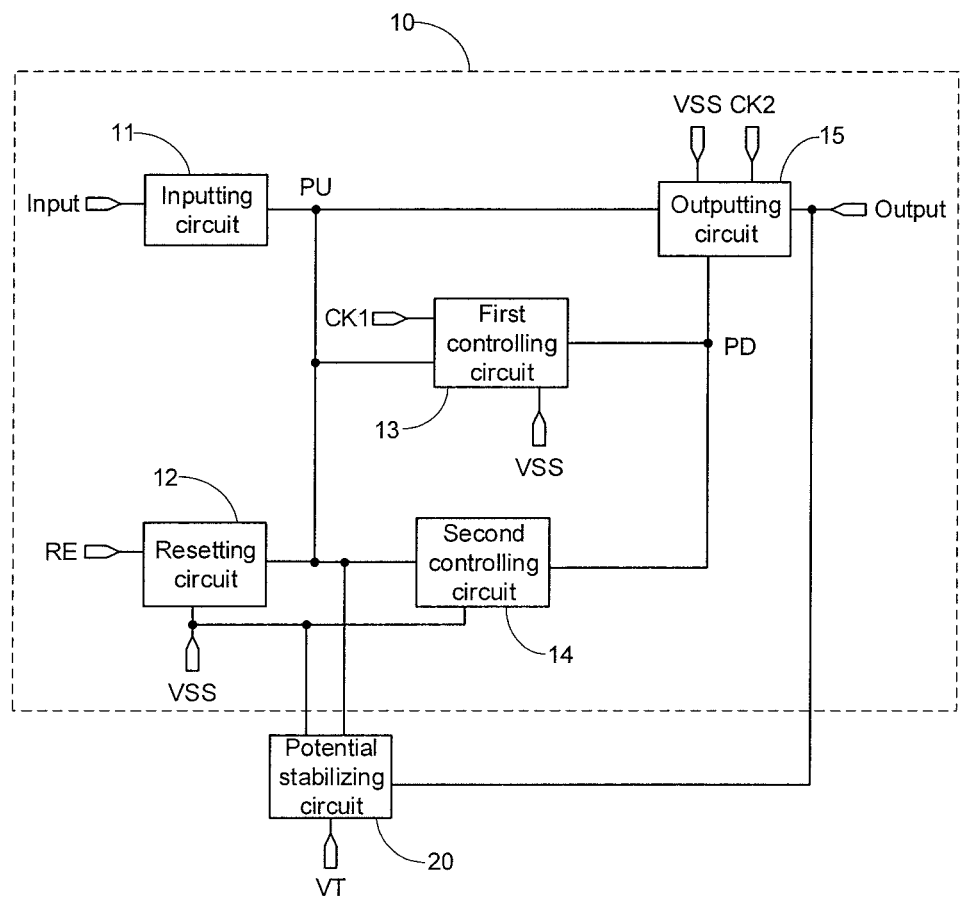
FIG. 1a shows a schematic structural diagram illustrating a shift register unit according to embodiments of the present disclosure.

Embodiments of the present disclosure provide a shift register unit. As shown in FIG. 1a, the shift register unit according to the embodiments of the present disclosure may include a shift register 10 comprising a pulling-up node PU. The shift register 10 is configured to output an effective level outputting signal at the outputting signal terminal Output under a control of a level at the pulling-up node PU. The shift register unit also comprises a potential stabilizing circuit 20.

Those skilled in the art can understand that the term "effective level" means a level that can connect lines of pixels coupled with each other. For example, when a transistor corresponding to the line of pixels is an N-type film transistor, the "effective level" refers to a relatively high level than can enable the N-type film transistor to be turned on; when the transistor corresponding to the line of pixels is a P-type film transistor, the "effective level" refers to a relatively low level than can enable the P-type film transistor to be turned on.

The potential stabilizing circuit 20 may be electrically coupled to a potential stabilizing controlling terminal VT, the pulling-up node PU, the outputting signal terminal Output, and a reference signal terminal VSS respectively, and configured to receive the potential stabilizing controlling signal from the potential stabilizing controlling terminal VT and provide a signal from the reference signal terminal VSS to the pulling-up node PU and the outputting signal terminal Output respectively, under a control of the potential stabilizing controlling signal.

The shift register unit according to the embodiments of the present disclosure may comprise the shift register and the potential stabilizing circuit. The potential stabilizing circuit may be configured to provide the signal from the reference signal terminal to the pulling-up node and the outputting signal terminal respectively, under the control of the potential stabilizing controlling signal from potential stabilizing controlling terminal. Therefore, with a cooperation between the shift register and the potential stabilizing circuit, the signal from the reference signal terminal can be supplied to the pulling-up node and the outputting signal terminal respectively, during a discharging holding period subsequent to a resetting period. Thus, it is possible to maintain the levels at the pulling-up node and the output signal terminal to be stable, which can prevent the outputting signal outputted from the outputting signal terminal from having a large noise, thereby improving the stability of the output of the shift register unit.

For example, when the inputting signal terminal has the effective level of a high level, the signal from the reference signal terminal VSS is at a low level, and the outputting signal has the effective level of the high level. When the inputting signal has the effective level of the low level, the signal from the reference signal terminal VSS is at the high level, and the outputting signal has the effective level of the low level.

As shown in FIG. 1a, the shift register 10 comprises: an inputting circuit 11, a resetting circuit 12, a first controlling circuit 13, a second controlling circuit 14, and an outputting circuit 15. The inputting circuit 11 is electrically coupled to the inputting signal terminal Input and the pulling-up node PU respectively, and configured to receive the inputting signal from the inputting signal terminal Input, and provide the inputting signal from the inputting signal terminal Input to the pulling-up node PU under a control of the inputting signal. The resetting circuit 12 is electrically coupled to the resetting signal terminal RE, the reference signal terminal VSS, and the pulling-up node PU respectively, and configured to provide the signal from the reference signal terminal VSS to the pulling-up node PU under a control of the signal from the resetting signal terminal RE. The first controlling circuit 13 is electrically coupled to a first clock signal terminal CK1, the pulling-up node PU, the reference signal terminal VSS, and a pulling-down node PD respectively, and configured to provide a first clock signal to the pulling-down node PD under a control of the first clock signal from the first clock signal terminal CK1, and provide the signal from the reference signal terminal VSS to the pulling-down node PD under the control of the level at the pulling-up node PU. The second controlling circuit 14 is electrically coupled to the pulling-up node PU, the pulling-down node PD, and the reference signal terminal VSS respectively, and configured to provide the signal from the reference signal terminal VSS to the pulling-up node PU under a control of a level at the pulling-down node PD.

The outputting circuit 15 is electrically coupled to a second clock signal terminal CK2, the pulling-up node PU, the pulling-down node PD, the reference signal terminal VSS, and the outputting signal terminal Output respectively, and configured to provide a second clock signal from the second clock signal terminal CK2 to the outputting signal terminal Output under the control of the level at the pulling-up node PU, maintain a difference between the level at the pulling-up node PU and a level at the outputting signal terminal Output in response to the pulling-up node PU being in a floating state, and provide the signal from the reference signal terminal VSS to the outputting signal terminal Output under the control of the level at the pulling-down node PD.

Figure 1B:
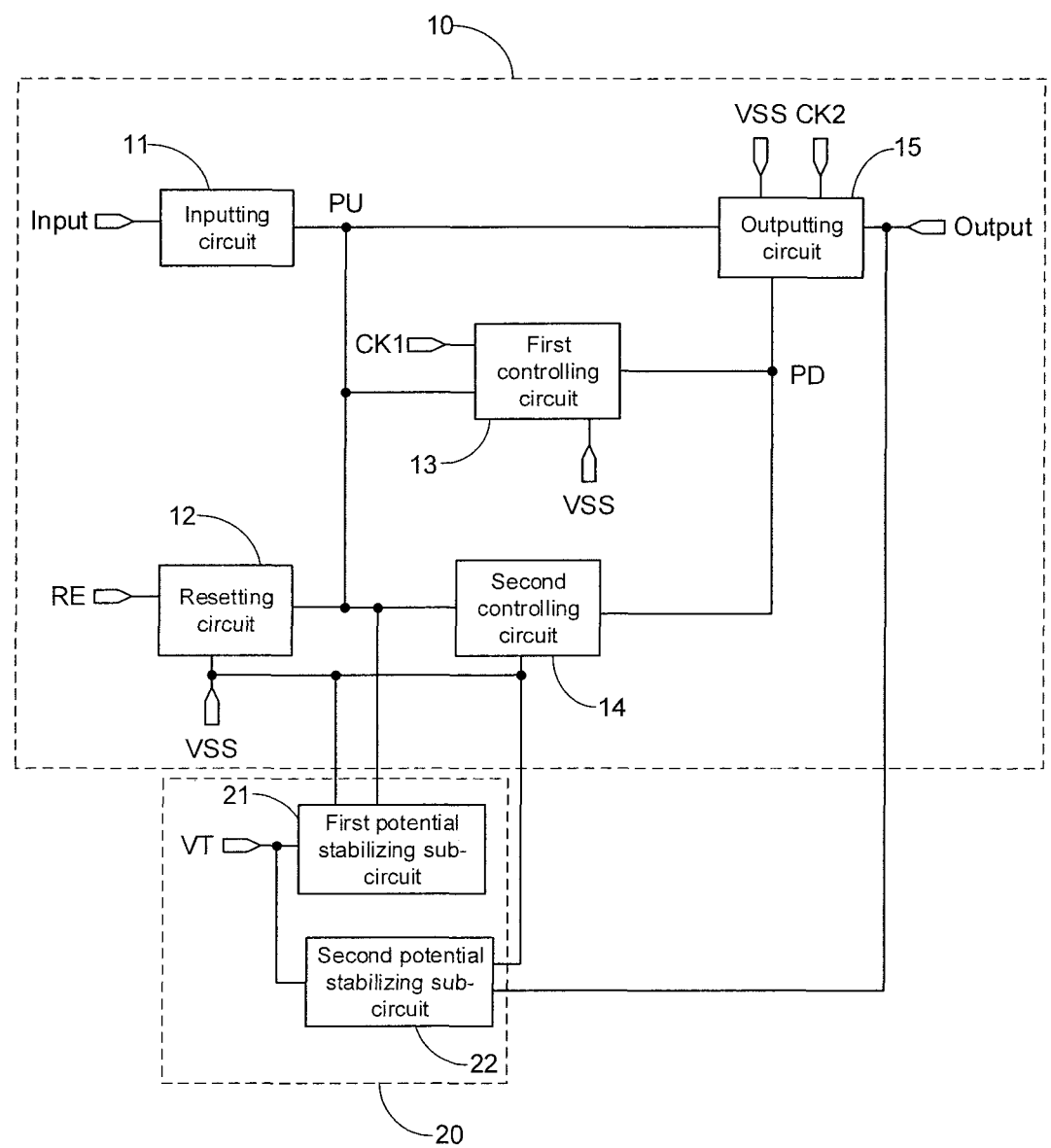
FIG. 1b shows another schematic structural diagram illustrating the shift register unit according to the embodiments of the present disclosure.

FIG. 1b shows another schematic structural diagram illustrating the shift register unit according to the embodiments of the present disclosure. As shown in FIG. 1b, the potential stabilizing circuit 20 may comprise a first potential stabilizing sub-circuit 21 and a second potential stabilizing sub-circuit 22. The first potential stabilizing sub-circuit 21 is electrically coupled to the potential stabilizing controlling terminal VT, the pulling-up node PU and the reference signal terminal VSS respectively, and configured to provide a signal from the reference signal terminal VSS to the pulling-up node PU under the control of the potential stabilizing controlling signal. The second potential stabilizing sub-circuit 22 is electrically coupled to the potential stabilizing controlling terminal VT, the outputting signal terminal Output and the reference signal terminal VSS respectively, and configured to provide the signal from the reference signal terminal VSS to the outputting signal terminal Output under the control of the potential stabilizing controlling signal.

In a specific implementation, the function of the potential stabilizing circuit is realized by the mutual cooperation of the first potential stabilizing sub-circuit and the second potential stabilizing sub-circuit.

The present disclosure will be described in detail below in conjunction with specific embodiments. It should be noted that the embodiments described herein are intended to better illustrate the present disclosure, rather than to limit the present disclosure.

Figure 2A:
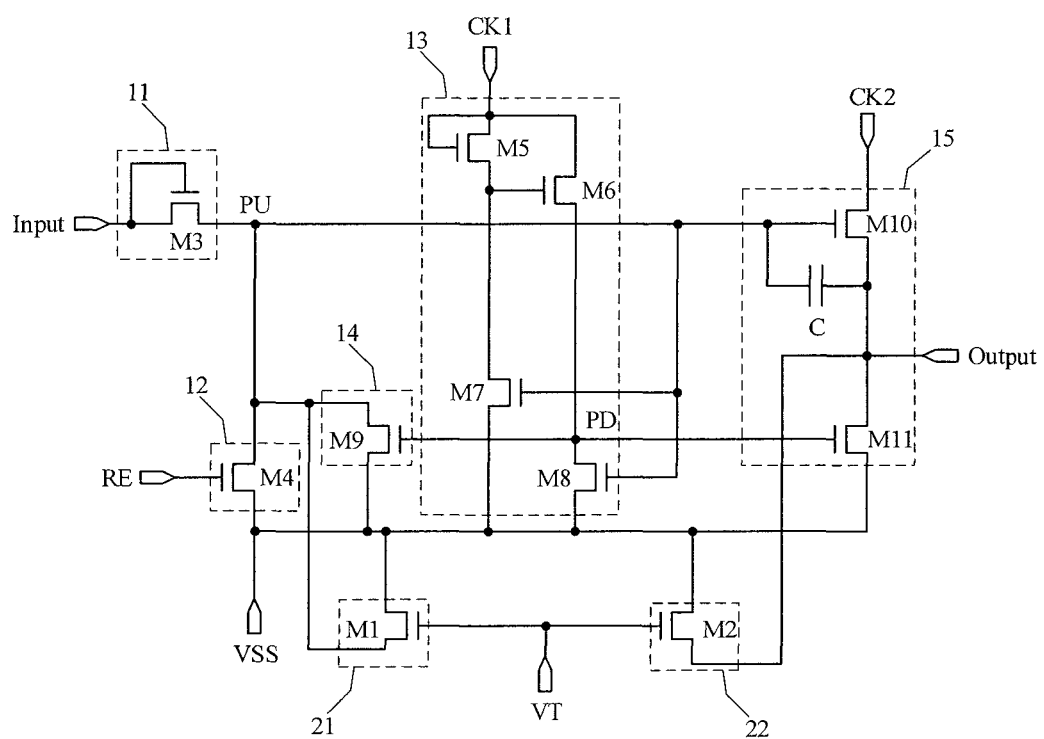
FIG. 2a shows a circuitry diagram illustrating the shift register unit according to the embodiments of the present disclosure.

FIG. 2a shows a circuitry diagram illustrating the shift register unit according to the embodiments of the present disclosure. As shown in FIG. 2a, the first potential stabilizing sub-circuit 21 may comprise: a first switching transistor M1 having a controlling electrode electrically coupled to the potential stabilizing controlling terminal VT, a first electrode electrically coupled to the reference signal terminal VSS, and a second electrode electrically coupled to the pulling-up node PU.

Figure 2B:
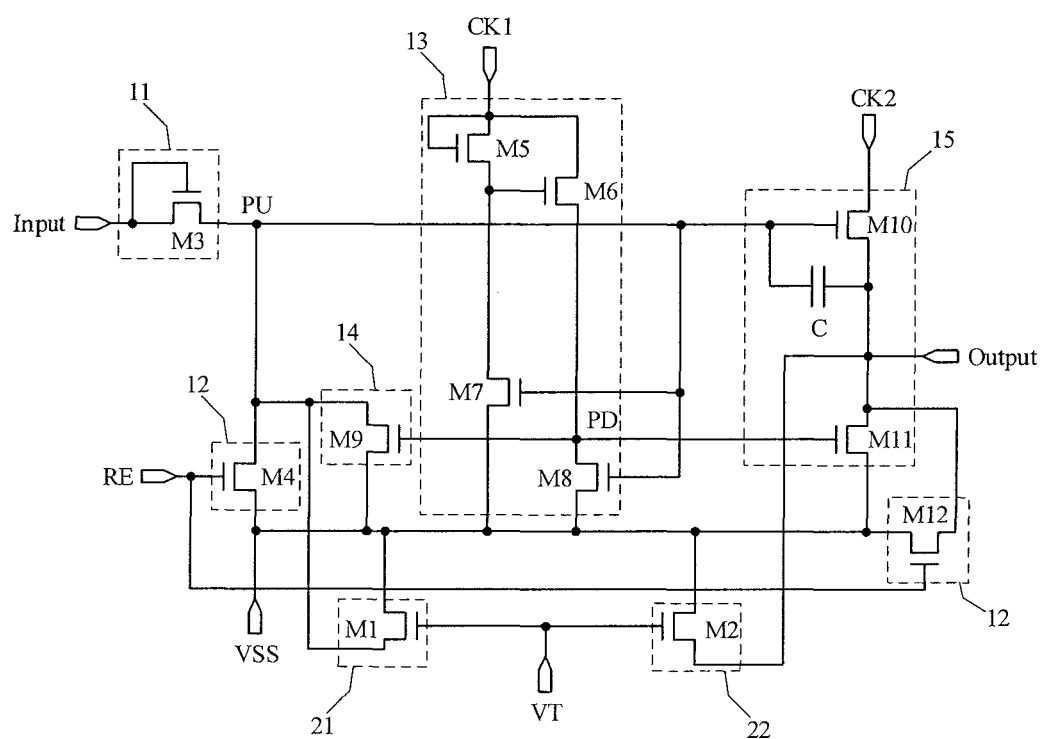
FIG. 2b shows another circuitry diagram illustrating the shift register unit according to the embodiments of the present disclosure.
Figure 2C:
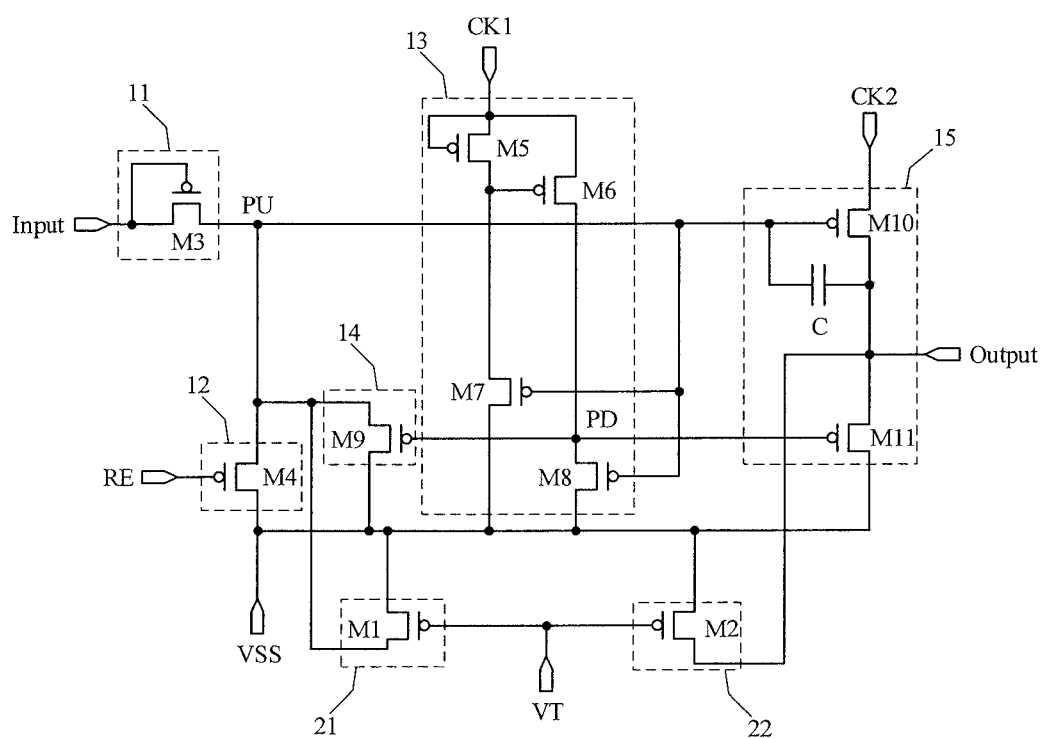
FIG. 2c shows another circuitry diagram illustrating the shift register unit according to the embodiments of the present disclosure.
Figure 2D:
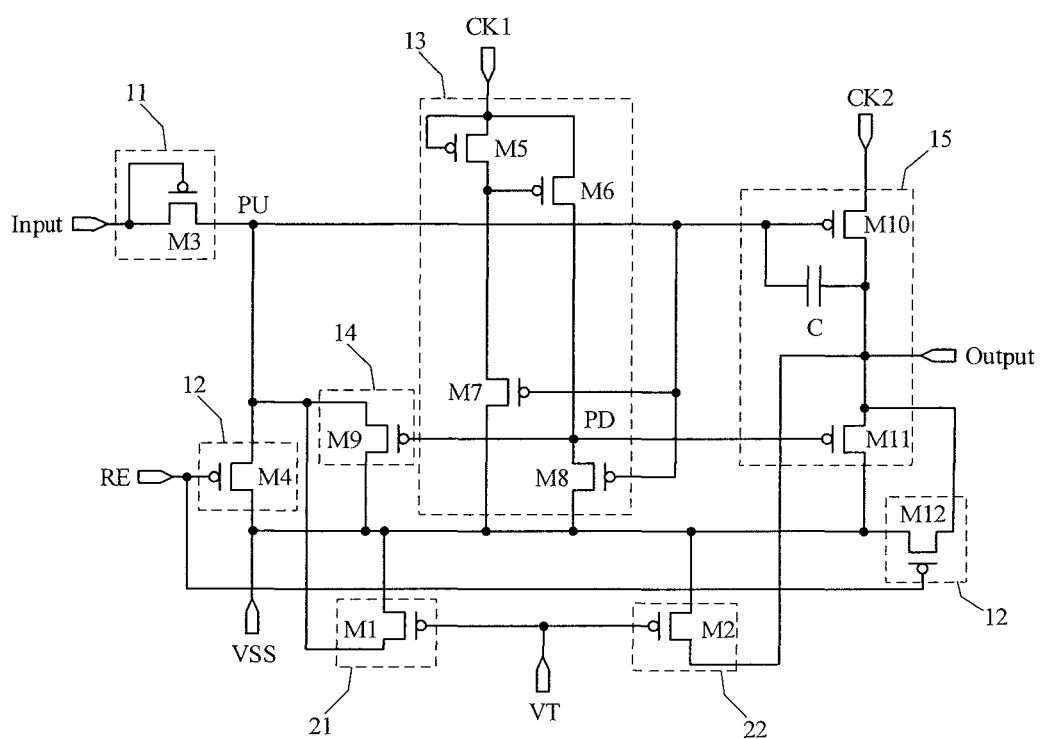
FIG. 2d shows another circuitry diagram illustrating the shift register unit according to the embodiments of the present disclosure.

FIG. 2b shows another circuitry diagram illustrating the shift register unit according to the embodiments of the present disclosure. FIG. 2c shows another circuitry diagram illustrating the shift register unit according to the embodiments of the present disclosure. FIG. 2d shows another circuitry diagram illustrating the shift register unit according to the embodiments of the present disclosure;

As shown in FIGS. 2a and 2b, the first switching transistor M1 may be an N-type switching transistor. Alternatively, as shown in FIGS. 2c and 2d, the first switching transistor M1 may also be a P-type switching transistor. In practice, the specific structure of the first switching transistor M1 should be determined according to the actual requirements, which is not limited herein.

Under the control of the potential stabilizing controlling signal, the signal from the reference signal terminal is supplied to the pulling-up node PU when the first switching transistor is in an ON state.

As shown in FIGS. 2a to 2d, the second potential stabilizing sub-circuit 22 may comprise: a second switching transistor M2 having a controlling electrode electrically coupled to the potential stabilizing controlling terminal VT, a first electrode electrically coupled to the reference signal terminal VSS, and a second electrode electrically coupled to the outputting signal terminal Output.

As shown in FIGS. 2a and 2b, the second switching transistor M2 may be an N-type switching transistor. Alternatively, as shown in FIGS. 2c and 2d, the second switching transistor M2 may also be a P-type switching transistor. In practice, the specific structure of the second switching transistor M2 should be determined according to the actual requirements, which is not limited herein.

Under the control of the potential stabilizing controlling signal, the signal from the reference signal terminal is supplied to the outputting signal terminal when the second switching transistor is in an ON state.

As shown in FIGS. 2a to 2d, the inputting circuit 11 may comprise: a third switching transistor M3 having a controlling electrode and a first electrode both electrically coupled to the inputting signal terminal Input, and a second electrode electrically coupled to the pulling-up node PU.

As shown in FIGS. 2a and 2b, the third switching transistor M3 may be an N-type switching transistor. Alternatively, as shown in FIGS. 2c and 2d, the third switching transistor M3 may also be a P-type switching transistor. In practice, the specific structure of the third switching transistor M3 should be determined according to the actual requirements, which is not limited herein.

Under the control of the inputting signal, the inputting signal is supplied to the pulling-up node by the third switching transistor.

The resetting circuit 12 may comprise a fourth switching transistor M4 having a controlling electrode electrically coupled to the resetting signal terminal RE, a first electrode electrically coupled to the reference signal terminal VSS, and a second electrode electrically coupled to the pulling-up node PU.

As shown in FIGS. 2a and 2b, the fourth switching transistor M4 may be an N-type switching transistor. Alternatively, as shown in FIGS. 2c and 2d, the fourth switching transistor M4 may also be a P-type switching transistor. In practice, the specific structure of the fourth switching transistor M4 should be determined according to the actual requirements, which is not limited herein.

For example, the resetting circuit 12 may further comprise a twelfth switching transistor M12 having a controlling electrode electrically coupled to the resetting signal terminal RE, a first electrode electrically coupled to the reference signal terminal VSS, and a second electrode electrically coupled to the outputting signal terminal Output.

As shown in FIG. 2b, the twelfth switching transistor M12 may be an N-type switching transistor. Alternatively, as shown in FIG. 2d, the twelfth switching transistor M12 may also be a P-type switching transistor. In practice, the specific structure of the twelfth switching transistor M12 should be determined according to the actual requirements, which is not limited herein.

Under the control of the signal from the resetting signal terminal, the signal from the reference signal terminal is supplied to the pulling-up node by the fourth switching transistor. Under the control of the signal from the resetting signal terminal, the signal from the reference signal terminal is supplied to the outputting signal terminal by the twelfth switching transistor.

The first controlling circuit 13 may comprise: a fifth switching transistor M5, a sixth switching transistor M6, a seventh switching transistor M7, and an eighth switching transistor M8. The fifth switching transistor M5 has a controlling electrode and a first electrode both electrically coupled to the first clock signal terminal CK1, and a second electrode electrically coupled to a controlling electrode of the sixth switching transistor M6. The sixth switching transistor M6 has a first electrode electrically coupled to the first clock signal terminal CK1 and a second electrode electrically coupled to the pulling-down node PD. The seventh switching transistor M7 has a controlling electrode electrically coupled to the pulling-up node PU, a first electrode electrically coupled to the reference signal terminal VSS, and a second electrode electrically coupled to the controlling electrode of the sixth switching transistor M6. The eighth switching transistor has a controlling electrode electrically coupled to the pulling-up node PU, a first electrode electrically coupled to the reference signal terminal VSS, and a second electrode electrically coupled to the pulling-down node PD.

As shown in FIGS. 2a and 2b, the fifth switching transistor M5, the sixth switching transistor M6, the seventh switching transistor M7, and the eighth switching transistor M8 may be N-type switching transistors. Alternatively, as shown in FIGS. 2c and 2d, the fifth switching transistor M5, the sixth switching transistor M6, the seventh switching transistor M7, and the eighth switching transistor M8 may also be P-type switching transistors. In practice, the specific structures of the fifth switching transistor M5, the sixth switching transistor M6, the seventh switching transistor M7, and the eighth switching transistor M8 should be determined according to the actual requirements, which are not limited herein.

According to the shift register unit of the present disclosure, under the control of the first clock signal, the first clock signal is supplied to the controlling electrode of the sixth switching transistor by the fifth switching transistor. When the seventh switching transistor is in the ON state under the control of the level at the pulling-up node, the signal from the reference signal terminal is supplied to the controlling electrode of the sixth switching transistor. When the sixth switching transistor is in the ON state under the control of the level at its controlling electrode, the first clock signal is supplied to the pulling-down node. When the eighth switching transistor is in the ON state under the control of the level at the pulling-up node, the signal from the reference signal terminal is supplied to the pulling-down node.

According to the shift register unit of above embodiments of the present disclosure, the size (i.e. aspect ratio of a channel) of the seventh switching transistor may be set larger than the size (i.e. aspect ratio of a channel) of the fifth switching transistor, such that when the inputting signal is at the effective level, the speed of supplying the signal from the reference signal terminal to the controlling electrode of the sixth switching transistor by the seventh switching transistor under the control of the level at the pulling-up node is greater than the speed of supplying the first clock signal to the controlling electrode of the sixth switching transistor by the fifth switching transistor under the control of the first clock signal. Thus, it is ensured that the sixth switching transistor is in an OFF state under the control of the level at its controlling electrode at this time.

The second controlling circuit 14 comprises: a ninth switching transistor M9 having a controlling electrode electrically coupled to the pulling-down node PD, a first electrode electrically coupled to the reference signal terminal VSS, and a second electrode electrically coupled to the pulling-up node PU.

As shown in FIGS. 2a and 2b, the ninth switching transistor M9 may be an N-type switching transistor. Alternatively, as shown in FIGS. 2c and 2d, the ninth switching transistor M9 may also be a P-type switching transistor. In practice, the specific structure of the ninth switching transistor M9 should be determined according to the actual requirements, which is not limited herein.

In an implementation, in the shift register unit according to the above embodiments of the present disclosure, the signal from the reference signal terminal is supplied to the pulling-up node in response to the ninth switching transistor being in the ON state under the control of the level at the pulling-down node.

The outputting circuit 15 may comprise: a tenth switching transistor M10, an eleventh switching transistor M11, and a capacitor C. The tenth switching transistor M10 has a controlling electrode electrically coupled to the pulling-up node PU, a first electrode electrically coupled to the second clock signal terminal CK2, and a second electrode electrically coupled to the outputting signal terminal Output. The eleventh switching transistor M11 has a controlling electrode electrically coupled to the pulling-down node PD, a first electrode electrically coupled to the reference signal terminal VSS, and a second electrode electrically coupled to the outputting signal terminal Output. The capacitor C has a first electrode electrically coupled to the pulling-up node PU and a second electrode electrically coupled to the outputting signal terminal Output.

As shown in FIGS. 2a and 2b, the tenth switching transistor M10 and the eleventh switching transistor M11 may be N-type switching transistors. Alternatively, as shown in FIGS. 2c and 2d, the tenth switching transistor M10 and the eleventh switching transistor M11 may also be P-type switching transistors. In practice, the specific structures of the tenth switching transistor M10 and the eleventh switching transistor M11 should be determined according to the actual requirements, which are not limited herein.

When the tenth switching transistor is in the ON state under the control of the level at the pulling-up node, the second clock signal is supplied to the outputting signal terminal. When the eleventh switching transistor is in the ON state under the control of the level at the pulling-down node, the signal from the reference signal terminal is supplied to the outputting signal terminal. The capacitor is charged under a control of the level at the pulling-up node and the outputting signal, and is discharged under the control of the level at the pulling-up node and the outputting signal. When the pulling-up node is in a floating state, the difference between the level at the pulling-up node and the level at the outputting signal terminal can be hold stable due to the bootstrap of the capacitor.

The above description is only an example illustrating specific structures of respective circuits in the shift register unit according to the embodiments of the present disclosure. The specific structure of the above-mentioned circuits is not limited to the above-mentioned structure provided by the embodiments of the present disclosure, and may be other structures known to those skilled in the art, which are not limited herein.

Further, in order to simplify the preparation process, when the inputting signal has the effective level of the high level, as shown in FIGS. 2a and 2b, all of the switching transistors may be N-type switching transistors. Alternatively, when the inputting signal has the effective level of a low level, as shown in FIGS. 2c and 2d, all of the switching transistors may be P-type switching transistors, which are not limited herein. Those skilled in the art can understand that the N-type switching transistor can be turned on by a high level signal and turned off by a low level signal; while the P-type switching transistor can be turned off by the high level signal and is turned on by the low level signal.

The switching transistor mentioned in the above embodiments of the present disclosure may be a thin film transistor (TFT) or a metal oxide semiconductor field effect transistor (MOS), which is not limited herein. In a specific implementation, the controlling electrode of the switching transistor can be implemented with the gate, the first electrode can be implemented with one of the source and the drain, and the second electrode can be implemented with the other one.

Hereinafter, the operation process of the shift register unit according to the above embodiments of the present disclosure will be described with reference to a circuitry timing chart, taking the specific structure of the shift register unit shown in FIGS. 2b and 2d as an example. In the following description, the high level signal is indicated by 1, and the low level signal is indicated by 0, wherein 1 and 0 are both intended to represent logic levels. It should be understood that 1 and 0 are only to better illustrate the operation of the shift register unit according to the above embodiments of the present disclosure, rather than to represent the levels applied to the gate of each switching transistor.

Figure 3A:
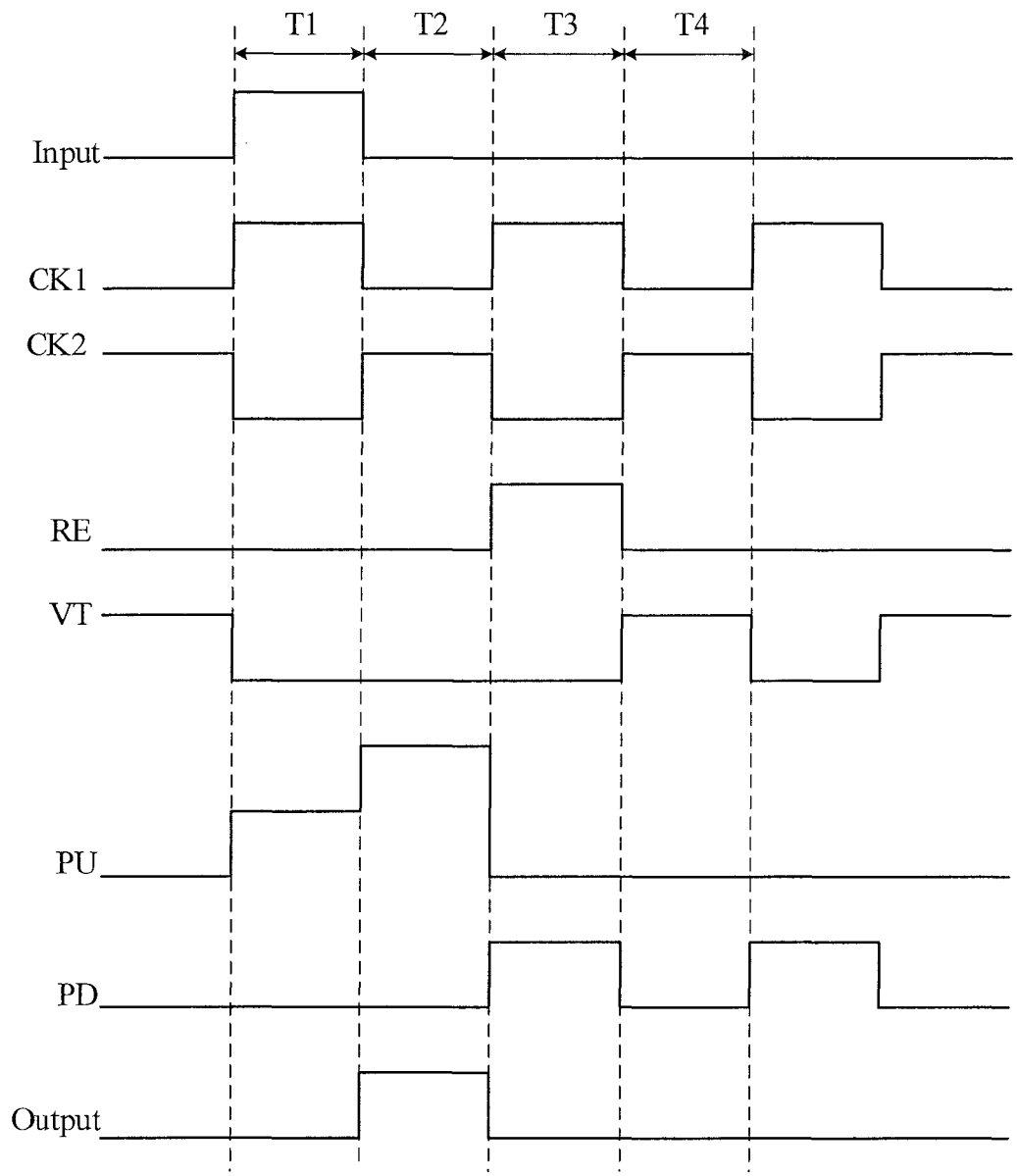
FIG. 3a shows an exemplary signal timing diagram of the shift register unit shown in FIG. 2b.

Taking the shift register unit shown in FIG. 2b as an example, the operation process will be described, wherein all of the switching transistors are N-type switching transistors, the signal from the reference signal terminal VSS is a low level signal, and the signal timing diagram of respective signal terminal is shown in FIG. 3a.

During a first period T1, Input=1, CK1=1, CK2=0, RE=0, VT=0. Since VT=0, the first switching transistor M1 and the second switching transistor M2 are turned off. Since RE=0, the fourth switching transistor M4 and the twelfth switching transistor M12 are turned off. Since Input=1, the third switching transistor M3 is turned on, and the inputting signal of the high level from the inputting signal terminal Input is supplied to the pulling-up node PU, so that the level at the pulling-up node PU is high. Since the pulling-up node PU is at a high level, the seventh switching transistor M7, the eighth switching transistor M8, and the tenth switching transistor M10 are all turned on. Since the seventh switching transistor M7 is turned on and supplies the low level signal from the reference signal terminal VSS to the gate of the sixth switching transistor M6, the gate of the sixth switching transistor M6 is at the low level. Accordingly, the sixth switching transistor M6 is turned off. Since the eighth switching transistor M8 is turned on and supplies the low level signal from the reference signal terminal VSS to the pulling-down node PD, the level at the pulling-down node PD is low. Since the pulling-down node PD is at the low level, the ninth switching transistor M9 and the eleventh switching transistor M11 are both turned off. Since the tenth switching transistor M10 is turned on and supplies the second clock signal CK2 of the low level to the outputting signal terminal Output, the outputting signal terminal Output outputs an outputting signal with a low level, and the capacitor C will be charged. For example, the first period can also be referred to as "an inputting period".

During the second period T2, Input=0, CK1=0, CK2=1, RE=0, VT=0. Since VT=0, the first switching transistor M1 and the second switching transistor M2 are both turned off. Since RE=0, the fourth switching transistor M4 and the twelfth switching transistor M12 are both turned off. Since Input=0, the third switching transistor M3 is turned off. Since CK1=0, the fifth switching transistor M5 is turned off. Therefore, the pulling-up node PU is in a floating state. Due to the capacitor C, the level at the pulling-up node PU can be kept high. Since the pulling-up node PU is at the high level, the seventh switching transistor M7, the eighth switching transistor M8, and the tenth switching transistor M10 are all turned on. Since the seventh switching transistor M7 is turned on and supplies the low level signal from the reference signal terminal VSS to the gate of the sixth switching transistor M6, the gate of the sixth switching transistor M6 is at the low level. Thus, the sixth switching transistor M6 is turned off. Since the eighth switching transistor M8 is turned on and supplies the low level signal from the reference signal terminal VSS to the pulling-down node PD, the level at the pulling-down node PD is low. Since the pulling-down node PD is at the low level, the ninth switching transistor M9 and the eleventh switching transistor M11 are both turned off. Since the tenth switching transistor M10 is turned on and supplies the e second clock signal CK2 of the high level to the outputting signal terminal Output, the outputting signal terminal Output outputs an outputting signal with a high level. Due to the bootstrap of the capacitor C, the difference between the level at the pulling-up node PU and the level at the outputting signal terminal Output can be kept stable. Since the outputting signal terminal Output is at the high level, the level at the pulling-up node PU is further pulled-up, so that the tenth switching transistor M10 is fully turned on as much as possible, thereby supplying the second clock signal terminal CK2 of the high level to the outputting signal terminal Output. Thus, the outputting signal terminal Output outputs the outputting signal with the high level, that is, the scanning signal of the effective level. For example, the second period can also be referred to as "an outputting period".

During a third period T3, Input=0, CK1=1, CK2=0, RE=1, VT=0. Since VT=0, the first switching transistor M1 and the second switching transistor M2 are both turned off. Since RE=1, the fourth switching transistor M4 and the twelfth switching transistor M12 are both turned on. Since Input=0, the third switching transistor M3 is turned off. Since CK1=1, the fifth switching transistor M5 is turned on. Since the fourth switching transistor M4 is turned on and supplies the low level signal from the reference signal terminal VSS to the pulling-up node PU, the level at the pulling-up node PU is low. Since the level at the pulling-up node PU is low, the seventh switching transistor M7, the eighth switching transistor M8, and the tenth switching transistor M10 are all turned off. Since the fifth switching transistor M5 is turned on and supplies the first clock signal CK1 of the high level to the gate of the sixth switching transistor M6, the gate of the sixth switching transistor M6 is at the high level. Thus, the sixth switching transistor M6 is turned on. Since the sixth switching transistor M6 is turned on and supplies the first clock signal CK1 of the high level to the pulling-down node PD, the level at the pulling-down node PD is high. Since the pulling-down node PD is at the high level, the ninth switching transistor M9 and the eleventh switching transistor M11 are both turned on. Since the ninth switching transistor M9 is turned on and supplies the low level signal from the reference signal terminal VSS to the pulling-up node PU, the pulling-up node PU is at the low level. Since the eleventh switching transistor M11 is turned on and supplies the low level signal from the reference signal terminal VSS to the outputting signal terminal Output, the outputting signal terminal Output outputs the low level outputting signal, and the capacitor C will be discharged. Since the twelfth switching transistor M12 is turned on and supplies the low level signal from the reference signal terminal VSS to the outputting signal terminal Output, the outputting signal terminal Output is also enabled to output the low level outputting signal. For example, the third period can also be referred to as "a resetting period".

During a fourth holding period T4, Input=0, CK1=0, CK2=1, RE=0, VT=1. Since VT=1, the first switching transistor M1 and the second switching transistor M2 are both turned on. Since RE=0, the fourth switching transistor M4 and the twelfth switching transistor M12 are both turned off. Since Input=0, the third switching transistor M3 is turned off. Since CK1=0, the fifth switching transistor M5 is turned off. Since the first switching transistor M1 is turned on and supplies the low level signal from the reference signal terminal VSS to the pulling-up node PU, the level at the pulling-up node PU is low. Since the level at the pulling-up node PU is low, the seventh switching transistor M7, the eighth switching transistor M8, and the tenth switching transistor M10 are all turned off. Since the second switching transistor M2 is turned on and supplies the low level signal from the reference signal terminal VSS to the outputting signal terminal Output, the outputting signal terminal Output outputs the low level output signal. For example, the fourth period can also be referred to as "a discharging holding period".

There is a signal sustaining period after the fourth period T4. During the signal sustaining period, Input=0, CK1=1, CK2=0, RE=0, VT=0. Since RE=0, the fourth switching transistor M4 and the twelfth switching transistor M12 are both turned off. The rest of the operation process is substantially the same as the operation process during the third period T3, and will not be described in detail herein.

The operation processes during the discharging holding period and the signal sustaining period are repeatedly performed until the level at the inputting signal terminal Input becomes high again.

According to the shift register unit of the present disclosure, during the discharging holding period, the signal from the pulling-up node is at the low level due to the first switching transistor. This can prevent the pulling-up node from being affected by the leakage of the surrounding transistors as compared with the pulling-up node in the floating state. In addition, due to the second switching transistor, the outputting signal terminal outputs the low level signal. This can prevent the outputting signal terminal from being affected by the surrounding transistors as compared with the outputting signal terminal in the floating state during the discharging holding period. After the resetting period, the level at the pulling-up node and the level at the outputting signal terminal can be kept stable all the time, due to an alternative functioning of the potential stabilizing controlling signal and the level at the pulling-down node, thereby avoiding the noise at the outputting signal terminal and improving the stability of outputting the signal by the outputting signal terminal of the shift register unit.

Figure 3B:
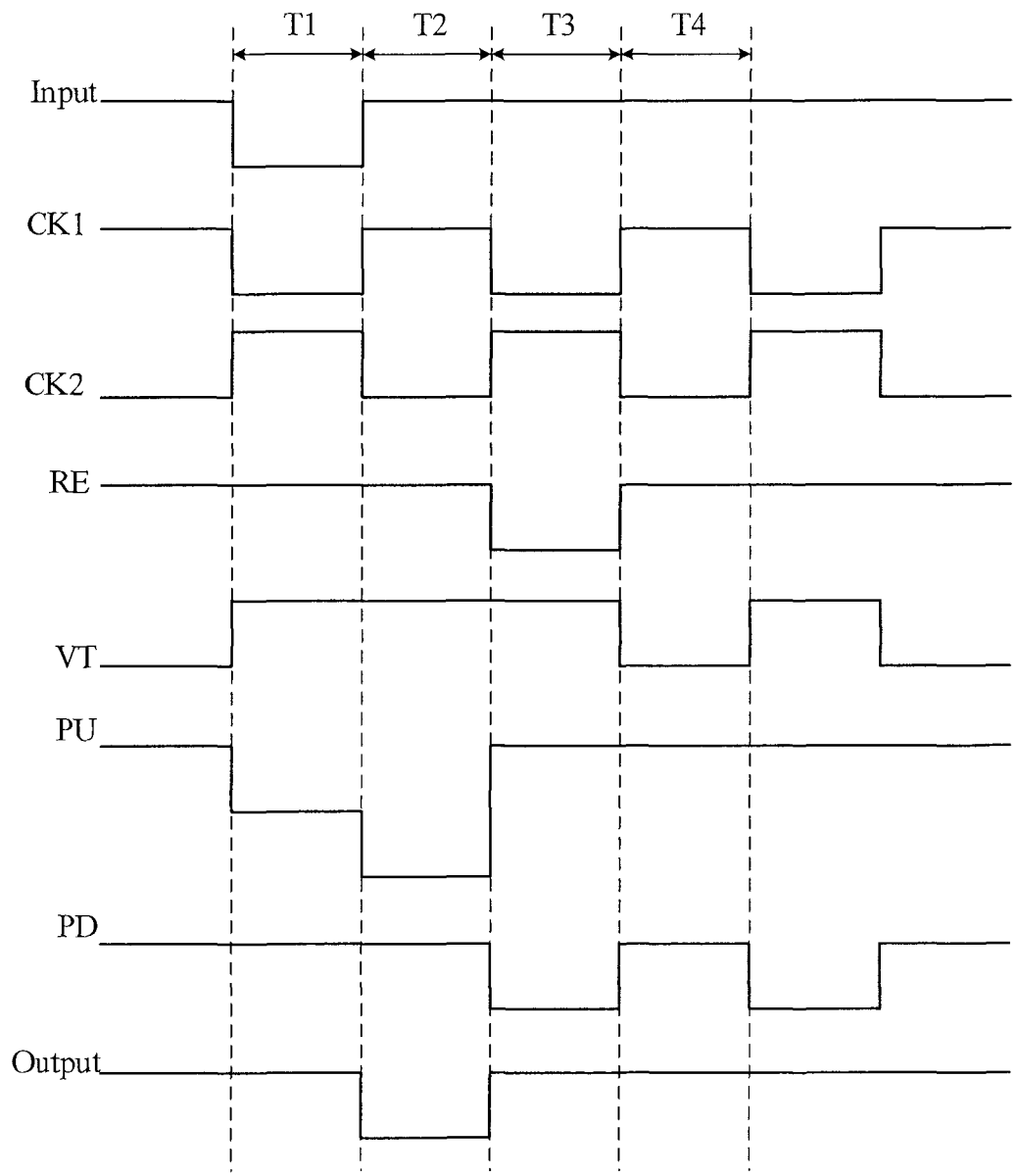
FIG. 3b shows an exemplary diagram of the shift register unit shown in FIG. 2d.

Next, the operation of the shift register unit shown in FIG. 2d is described as an example, wherein the signal from the reference signal terminal VSS is a high level signal. The input and output timing diagram of the shift register unit is shown in FIG. 3b.

During the first period T1, Input=0, CK1=0, CK2=1, RE=1, VT=1. Since VT=1, the first switching transistor M1 and the second switching transistor M2 are turned off. Since RE=1, the fourth switching transistor M4 and the twelfth switching transistor M12 are turned off. Since Input=0, the third switching transistor M3 is turned on, and the low level signal from the inputting signal terminal Input is supplied to the pulling-up node PU, so that the level at the pulling-up node PU is low. Since the pulling-up node PU is at a low level, the seventh switching transistor M7, the eighth switching transistor M8, and the tenth switching transistor M10 are all turned on. Since the seventh switching transistor M7 is turned on and supplies the high level signal from the reference signal terminal VSS to the gate of the sixth switching transistor M6, the gate of the sixth switching transistor M6 is at the high level. Accordingly, the sixth switching transistor M6 is turned off. Since the eighth switching transistor M8 is turned on and supplies the high level signal from the reference signal terminal VSS to the pulling-down node PD, the level at the pulling-down node PD is high. Since the pulling-down node PD is at the high level, the ninth switching transistor M9 and the eleventh switching transistor M11 are both turned off. Since the tenth switching transistor M10 is turned on and supplies the high level signal from the second clock signal terminal CK2 to the outputting signal terminal Output, the outputting signal terminal Output outputs an outputting signal with a high level, and the capacitor C will be charged.

During the second period T2, Input=1, CK1=1, CK2=0, RE=1, VT=1. Since VT=1, the first switching transistor M1 and the second switching transistor M2 are both turned off. Since RE=1, the fourth switching transistor M4 and the twelfth switching transistor M12 are both turned off. Since Input=1, the third switching transistor M3 is turned off. Since CK1=1, the fifth switching transistor M5 is turned off. Therefore, the pulling-up node PU is in a floating state. Due to the capacitor C, the level at the pulling-up node PU can be kept low. Since the pulling-up node PU is at the low level, the seventh switching transistor M7, the eighth switching transistor M8, and the tenth switching transistor M10 are all turned on. Since the seventh switching transistor M7 is turned on and supplies the high level signal from the reference signal terminal VSS to the gate of the sixth switching transistor M6, the gate of the sixth switching transistor M6 is at the high level. Thus, the sixth switching transistor M6 is turned off. Since the eighth switching transistor M8 is turned on and supplies the high level signal from the reference signal terminal VSS to the pulling-down node PD, the level at the pulling-down node PD is high. Since the pulling-down node PD is at the high level, the ninth switching transistor M9 and the eleventh switching transistor M11 are both turned off. Since the tenth switching transistor M10 is turned on and supplies the low level signal from the second clock signal terminal CK2 to the outputting signal terminal Output, the outputting signal terminal Output outputs an outputting signal with a low level. Due to the bootstrap of the capacitor C, the difference between the level at the pulling-up node PU and the level at the outputting signal terminal Output can be kept stable. Since the outputting signal terminal Output is at the low level, the level at the pulling-up node PU is further pulled-down, so that the tenth switching transistor M10 is fully turned on as much as possible, thereby supplying the low level signal from the second clock signal terminal CK2 to the outputting signal terminal Output. Thus, the outputting signal terminal Output outputs the outputting signal with the low level, that is, the outputting signal of the effective level.

During the third period T3, Input=1, CK1=0, CK2=1, RE=0, VT=1. Since VT=1, the first switching transistor M1 and the second switching transistor M2 are both turned off. Since RE=0, the fourth switching transistor M4 and the twelfth switching transistor M12 are both turned on. Since Input=1, the third switching transistor M3 is turned off. Since CK1=0, the fifth switching transistor M5 is turned on. Since the fourth switching transistor M4 is turned on and supplies the high level signal from the reference signal terminal VSS to the pulling-up node PU, the level at the pulling-up node PU is high. Since the level at the pulling-up node PU is high, the seventh switching transistor M7, the eighth switching transistor M8, and the tenth switching transistor M10 are all turned off. Since the fifth switching transistor M5 is turned on and supplies the first clock signal of the low level from the first clock signal terminal CK1 to the gate of the sixth switching transistor M6, the gate of the sixth switching transistor M6 is at the low level. Thus, the sixth switching transistor M6 is turned on. Since the sixth switching transistor M6 is turned on and supplies the first clock signal of the low level from the first clock signal terminal CK1 to the pulling-down node PD, the level at the pulling-down node PD is low. Since the pulling-down node PD is at the low level, the ninth switching transistor M9 and the eleventh switching transistor M11 are both turned on. Since the ninth switching transistor M9 is turned on and supplies the high level signal from the reference signal terminal VSS to the pulling-up node PU, the pulling-up node PU is at the high level. Since the eleventh switching transistor M11 is turned on and supplies the high level signal from the reference signal terminal VSS to the outputting signal terminal Output, the outputting signal terminal Output outputs the high level outputting signal, and the capacitor C will be discharged. Since the twelfth switching transistor M12 is turned on and supplies the high level signal from the reference signal terminal VSS to the outputting signal terminal Output, the outputting signal terminal Output is also enabled to output the high level outputting signal.

During the fourth period T4, Input=1, CK1=1, CK2=0, RE=1, VT=0. Since VT=0, the first switching transistor M1 and the second switching transistor M2 are both turned on. Since RE=1, the fourth switching transistor M4 and the twelfth switching transistor M12 are both turned off. Since Input=1, the third switching transistor M3 is turned off. Since CK1=1, the fifth switching transistor M5 is turned off. Since the first switching transistor M1 is turned on and supplies the high level signal from the reference signal terminal VSS to the pulling-up node PU, the level at the pulling-up node PU is high. Since the level at the pulling-up node PU is high, the seventh switching transistor M7, the eighth switching transistor M8, and the tenth switching transistor M10 are all turned off. Since the second switching transistor M2 is turned on and supplies the high level signal from the reference signal terminal VSS to the outputting signal terminal Output, the outputting signal terminal Output outputs the high level outputting signal.

There is the signal sustaining period after the fourth period T4. During the signal sustaining period, Input=1, CK1=0, CK2=1, RE=1, VT=1. Since RE=1, the fourth switching transistor M4 and the twelfth switching transistor M12 are both turned off. The rest of the operation process is substantially the same as the operation process during the third period T3, and will not be described in detail herein.

The operation processes during the fourth period and the signal sustaining period are repeatedly performed until the level at the inputting signal terminal Input becomes low again.

According to the shift register unit of the present disclosure, during the fourth period, the signal from the pulling-up node is at the high level due to the first switching transistor. This can prevent the pulling-up node from being affected by the leakage of the surrounding transistors as compared with the pulling-up node in the floating state. In addition, due to the second switching transistor, the outputting signal terminal is enabled to output the high level outputting signal. This can prevent the outputting signal terminal from being affected by the surrounding transistors as compared with the outputting signal terminal in the floating state. After the third period, the level at the pulling-up node and the level of the outputting signal at the outputting signal terminal can be kept stable all the time, due to an alternative functioning of the potential stabilization controlling signal and the level at the pulling-down node, thereby avoiding the noise at the outputting signal terminal and improving the stability of the signal from the outputting signal terminal of the shift register unit.

Figure 4:
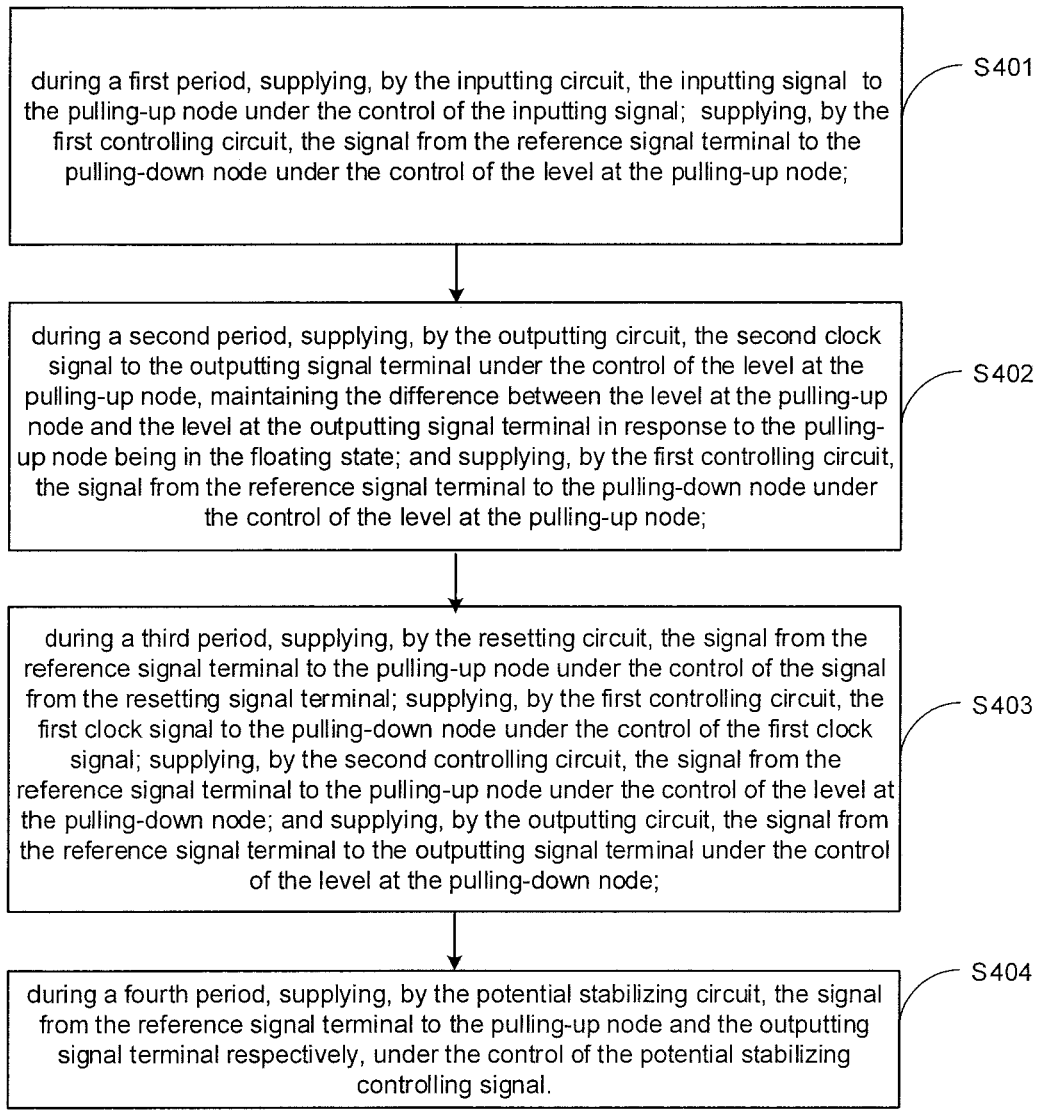
FIG. 4 shows a flow chart of a method for driving the shift register unit according to the embodiments of the present disclosure.

Embodiments of the present disclosure also provide a driving method of a shift register unit. As shown in FIG. 4, the driving method may comprise the following steps.

In step S401, during the first period, the inputting circuit may supply the inputting signal to the pulling-up node under the control of the inputting signal. The first controlling circuit may supply the signal from the reference signal terminal to the pulling-down node under the control of the level at the pulling-up node.

In step S402, during the second period, the outputting circuit may supply the second clock signal to the outputting signal terminal under the control of the level at the pulling-up node, The difference between the level at the pulling-up node and the level at the outputting signal terminal is kept stable in response to the pulling-up node being in the floating state. The first controlling circuit may supply the signal from the reference signal terminal to the pulling-down node under the control of the level at the pulling-up node.

In step S403, during the third period, the resetting circuit may supply the signal from the reference signal terminal to the pulling-up node under the control of the signal from the resetting signal terminal. The first controlling circuit may supply the signal from the first clock signal terminal to the pulling-down node under the control of the first clock signal. The second controlling circuit may supply the signal from the reference signal terminal to the pulling-up node under the control of the level at the pulling-down node. The outputting circuit may supply the signal from the reference signal terminal to the outputting signal terminal under the control of the level at the pulling-down node In step S404, during the fourth period, the potential stabilizing circuit may supply the signal from the reference signal terminal to the pulling-up node and the outputting signal terminal respectively, under the control of the potential stabilizing controlling signal.

According to the driving method of the embodiment of the present disclosure, the level at the pulling-up node PU and the level at the outputting signal terminal Output can be kept stable, thereby avoiding the outputting signal from the outputting signal terminal Output having a large noise, thereby enabling the shift register unit to output the scanning signal stably.

There may be a signal sustaining period after the fourth period. During the signal sustaining period, the first controlling circuit may supply the first clock signal to the pulling-down node under the control of the first clock signal. The second controlling circuit may supply the signal from the reference signal terminal to the pulling-up node under the control of the level at the pulling-down node. The outputting circuit may supply the signal from the reference signal terminal to the outputting signal terminal under the level at the pulling-down node.

Figure 5:
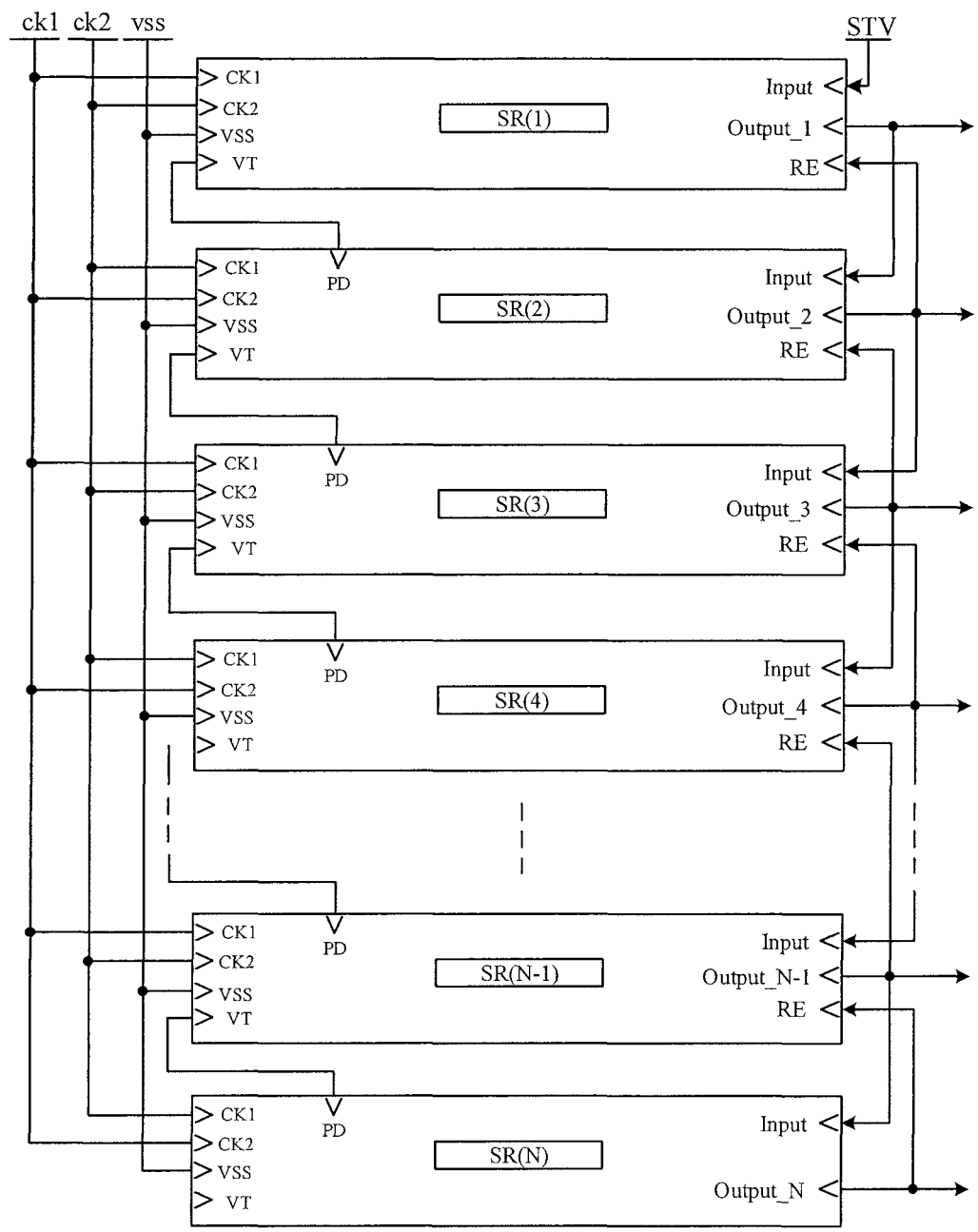
FIG. 5 shows a schematic structural diagram of a gate driving circuit according to the embodiments of the present disclosure.

Embodiments of the present disclosure also provide a gate driving circuit. As shown in FIG. 5, the gate driving circuit according to the embodiments of the present disclosure may include a plurality of shift register units according to the present embodiments which are cascaded, i.e. SR(1), SR(2) . . . SR(n) . . . SR(N−1), SR(N), 1≤n≤N, N is an integer greater than or equal to 1. Each of the shift register units SR(n) other than the shift register unit in a last stage SR(N) has the potential stabilizing controlling terminal VT electrically coupled to the pulling-down node PD of the shift register unit in a subsequent stage SR(n+1).

According to the gate driving circuit of the embodiment of the present disclosure, the signal from the potential stabilizing controlling terminal of the shift register in the current stage can be applied to the pulling-down node of the shift register unit in the subsequent stage, thereby simplifying the structure of the gate driving circuit and reducing the cost.

For example, a corresponding signal can be input to the potential stabilizing controlling terminal VT of the shift register unit in the last stage through a signaling line. Alternatively, the potential stabilizing controlling terminal of the shift register unit in the last stage can also be electrically coupled to the pulling-down node of the shift register unit in the first stage. Of course, it is also possible not to input the corresponding signal to the potential stabilizing controlling terminal of the shift register unit in the last stage. The setting of the potential stabilization controlling terminal of the shift register unit in the last stage should be determined according to application requirements, which is not limited herein.

For example, as shown in FIG. 5, the inputting signal terminal Input of the shift register unit in the first stage SR(1) may be electrically coupled to a frame triggering signal terminal STV. Each of the shift register units SR(n) other than the shift register unit in the first stage SR(1) has the inputting signal terminal Input which may be electrically coupled to the outputting signal terminal Output of the shift register unit in a previous stage SR(n−1).

Each of the shift register units SR(n) other than the shift register unit in the last stage SR(N) has the resetting signal terminal RE which may be electrically coupled to the outputting signal terminal Output of the shift register unit in the subsequent stage SR(n+1).

The gate driving circuit according to the embodiments of the present disclosure may be applied to a liquid crystal display panel, and may also be applied to an organic electroluminescent display panel, which is not limited herein.

For example, as shown in FIG. 5, the reference signal terminals VSS of the shift register units in each stage are electrically coupled to a same signal terminal, that is, the DC signal terminal VSS.

For example, as shown in FIG. 5, the first clock signal terminal CK1 of the shift register unit in the $2k-1^{th}$ stage and the second clock signal terminal CK2 of the shift register unit in $2k^{th}$ stage are both coupled to the first clock terminal CK1. The second clock signal terminal CK2 of the shift register unit in the $2k-1^{th}$ stage and the first clock signal terminal CK1 of the shift register unit in the $2k^{th}$ stage are both electrically coupled to the second clock terminal CK2, wherein k is an integer greater than or equal to 1. The clock signal from the first clock terminal CK1 has a phase opposite to the clock signal from the second clock terminal CK2, and a period as same as the signal from the second clock terminal CK2.

Embodiments of the present disclosure also provide a display device including the gate driving circuit of the present disclosure. The implementation of the display device may be made reference to the embodiment of the above-described gate driving circuit, and which will not be described herein.

The display device can be any product or component having a display function, such as a mobile phone, a tablet computer, a television, a displayer, a notebook computer, a digital photo frame, a navigator, and the like. For example, the display device can also refer to display panels on objects such as mobile phones, tablets, televisions, monitors, notebook computers, digital photo frames, and navigators. Certainly, other indispensable components of the display device which are not described herein should be apparent to those skilled in the art, and neither should be construed as limiting the invention.

It will be apparent to those skilled in the art that various changes and modifications can be made in the present disclosure without departing from the spirit and scope of the disclosure. Thus, the present disclosure is intended to cover such changes and modifications.

We claim:

1. A shift register unit, comprising:
   a shift register comprising a pulling-up node, wherein the shift register is configured to output an outputting signal of an effective level at an outputting signal terminal under a control of a level at the pulling-up node; and
   a potential stabilizing circuit configured to receive a potential stabilizing controlling signal from a potential stabilizing controlling signal terminal and provide a signal from a reference signal terminal to the pulling-up node and the outputting signal terminal respectively, under a control of the potential stabilizing controlling signal;
   wherein the shift register comprises: a first controlling circuit, a second controlling circuit, and an outputting circuit, wherein
   the first controlling circuit is configured to receive a first clock signal from a first clock signal terminal, and provide the first clock signal to a pulling-down node under a control of the first clock signal, and provide the signal from the reference signal terminal to the pulling-down node under the control of the level at the pulling-up node;
   the second controlling circuit is configured to provide the signal from the reference signal terminal to the pulling-up node under a control of a level at the pulling-down node; and
   the outputting circuit is configured to provide a second clock signal from a second clock signal terminal to the outputting signal terminal under the control of the level at the pulling-up node, maintain a difference between the level at the pulling-up node and a level at the outputting signal terminal in response to the pulling-up node being in a floating state, and provide the signal from the reference signal terminal to the outputting signal terminal under the control of the level at the pulling-down node.

2. The shift register unit of claim 1, wherein the shift register further comprises: an inputting circuit, and a resetting circuit, wherein
   the inputting circuit is configured to receive an inputting signal from an inputting signal terminal, and provide the inputting signal to the pulling-up node under a control of the inputting signal; and
   the resetting circuit is configured to provide the signal from the reference signal terminal to the pulling-up node under a control of a signal from a resetting signal terminal.

3. The shift register unit of claim 2, wherein the inputting circuit comprises: a third switching transistor having a controlling electrode and a first electrode both electrically coupled to the inputting signal terminal, and a second electrode electrically coupled to the pulling-up node;
   the resetting circuit comprises: a fourth switching transistor having a controlling electrode electrically coupled to the resetting signal terminal, a first electrode electrically coupled to the reference signal terminal, and a second electrode electrically coupled to the pulling-up node;
   the first controlling circuit comprises: a fifth switching transistor, a sixth switching transistor, a seventh switching transistor, and an eighth switching transistor, wherein the fifth switching transistor has a controlling electrode and a first electrode both electrically coupled to the first clock signal terminal, and a second electrode electrically coupled to a controlling electrode of the sixth switching transistor; the sixth switching transistor has a first electrode electrically coupled to the first clock signal terminal and a second electrode electrically coupled to the pulling-down node; the seventh switching transistor has a controlling electrode electrically coupled to the pulling-up node, a first electrode electrically coupled to the reference signal terminal, and a second electrode electrically coupled to the controlling electrode of the sixth switching transistor; the eighth switch transistor has a controlling electrode electrically coupled to the pulling-up node, a first electrode electrically coupled to the reference signal terminal, and a second electrode electrically coupled to the pulling-down node;
   the second controlling circuit comprises: a ninth switching transistor having a controlling electrode electrically coupled to the pulling-down node, a first electrode electrically coupled to the reference signal terminal, and a second electrode electrically coupled to the pulling-up node; and
   the outputting circuit comprises: a tenth switching transistor, an eleventh switching transistor, and a capacitor, wherein the tenth switching transistor has a controlling electrode electrically coupled to the pulling-up node, a first electrode electrically coupled to the second clock signal terminal, and a second electrode electrically coupled to the outputting signal terminal; the eleventh switching transistor has a controlling electrode electrically coupled to the pulling-down node, a first electrode electrically coupled to the reference signal terminal, and a second electrode electrically coupled to the outputting signal terminal; the capacitor has a first electrode electrically coupled to the pulling-up node and a second electrode electrically coupled to the outputting signal terminal.

4. A method for driving the shift register unit of claim 2, comprising:
during a first period,
supplying, by the inputting circuit, the inputting signal to the pulling-up node under the control of the inputting signal; and
supplying, by the first controlling circuit, the signal from the reference signal terminal to the pulling-down node under the control of the level at the pulling-up node; and
during a second period,
supplying, by the outputting circuit, the second clock signal to the outputting signal terminal under the control of the level at the pulling-up node, and
maintaining the difference between the level at the pulling-up node and the level at the outputting signal terminal in response to the pulling-up node being in the floating state;
during a third period,
supplying, by the resetting circuit, the signal from the reference signal terminal to the pulling-up node under the control of the signal from the resetting signal terminal;
supplying, by the first controlling circuit, the first clock signal to the pulling-down node under the control of the first clock signal;
supplying, by the second controlling circuit, the signal from the reference signal terminal to the pulling-up node under the control of the level at the pulling-down node; and
supplying, by the outputting circuit, the signal from the reference signal terminal to the outputting signal terminal under the control of the level at the pulling-down node; and
during a fourth period,
supplying, by the potential stabilizing circuit, the signal from the reference signal terminal to the pulling-up node and the outputting signal terminal respectively, under the control of the potential stabilizing controlling signal.

5. A gate driving circuit comprising a plurality of shift register units according to claim 1 which are cascaded, wherein:
each of the shift register units other than the shift register unit in a last stage has the potential stabilizing controlling terminal electrically coupled to the pulling-down node of the shift register unit in a subsequent stage.

6. The gate driving circuit of claim 5, wherein the shift register unit in a first stage has the inputting signal terminal electrically coupled to a frame triggering signal terminal;
each of the shift register units other than the shift register unit in the first stage has the inputting signal terminal electrically coupled to the outputting signal terminal of the shift register unit in a previous stage; and
each of the shift register units other than the shift register unit in the last stage has the resetting signal terminal electrically coupled to the outputting signal terminal of the shift register unit in the subsequent stage.

7. A display device comprising the gate driving circuit of claim 6.

8. A display device comprising the gate driving circuit of claim 5.

* * * * *